PRESSURE SENSITIVE BILATERAL NEGATIVE RESISTANCE DEVICE

Filed Dec. 1, 1966

United States Patent Office 3,465,176

Patented Sept. 2, 1969

3,465,176

PRESSURE SENSITIVE BILATERAL NEGATIVE RESISTANCE DEVICE

Masaru Tanaka, Toyonaka-shi, and Akio Yamashita, Ikeda-shi, Japan, assignors to Matsushita Electric Industrial Co., Ltd., Osaka, Japan, a corporation of Japan Filed Dec. 1, 1966, Ser. No. 598,297

Claims priority, application Japan, Dec. 10, 1965, 40/76,823

Int. Cl. H03k *1/00, 19/08, 3/26*

U.S. Cl. 307—308 5 Claims

ABSTRACT OF THE DISCLOSURE

A pressure sensitive bilateral negative resistance device is disclosed. The device has a body at least part of which is composed of a semiconductive material or an insulating material which have been doped with a deep-level impurity. At least two electrical connections exhibiting the same type of conduction are provided to that part of the body which has been doped with a deep-level impurity.

This invention relates to an electric apparatus and more particularly to an electric apparatus of a simple structure having a bilateral negative resistance characteristic, said negative resistance characteristic being controllable with pressure.

It is known that when a bias voltage is applied to a known p-i-n diode as shown in FIG. 1 in a forward direction, a negative resistance characteristic, as shown in FIG. 2, appears. This phenomenon is theoretically explained by introducing the concept of "double injection." In FIG. 1, the i-region is a region doped with impurity, forming a deep level in the forbidden band of a semi-conductor or of a solid including a forbidden band like an insulator. The p- and n-regions are regions having p-type and n-type conduction, respectively. The known p-i-n diode as described above is an element having a unilateral negative resistance characteristic. On the other hand, it is an object of the present invention to provide an electric apparatus having a bilateral negative resistance characteristic and characterized in that there are provided at least two electric connections having the same type of conduction as that of the i-region doped with impurity forming a deep level in a semiconductor or a solid including a forbidden band like an insulator.

It is another object of the invention to provide an electric apparatus whose bilateral negative resistance characteristic may be controlled with pressure.

It is a further object of the invention to provide an electric apparatus in which a negative resistance characteristic appearing between two terminals can be controlled with another terminal.

Other objects, features and advantages of the invention will become apparent from the following detailed description of the invention when taken in conjunction with the accompanying drawings, in which.

Firstly, the principle of an electric apparatus according to the present invention will be described.

Figure 1:
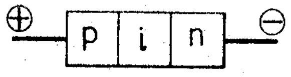
FIG. 1 is a front view of a known p-i-n diode.
Figure 2:
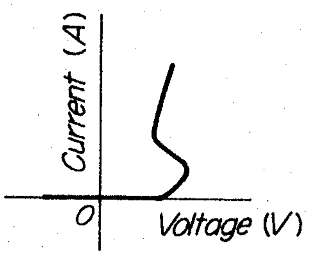
FIG. 2 shows a voltage vs. current chtracteristic obtained with the known diode shown in FIG. 1.
Figure 3:
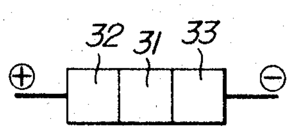
FIGS. 3 and 4 are front views of different electric apparatuses embodying the invention.

FIG. 3 is a diagram illustrating the principle of the structure of an electric apparatus according to the invention, in which 31 designates an i-region doped with impurity forming a deep-level in a solid comprising a forbidden band like an insulator or a semiconductor and 32 and 33 indicate regions having the same type of conduction and having a rectifying property with respect to the i-region 31. For convenience of illustration, said regions 332 and 333 are assumed hereinbelow to have an n-type conduction.

When a bias is applied to the electric apparatus, according to the invention, in a direction shown in FIG. 3, an inverse bias appears at the junction between the regions 32 and 31 and a forward bias appears at the junction between the regions 31 and 33. Accordingly, the electric field is applied mostly to the junction between the regions 32 and 31 and a depletion region extends widely into the side of the i-region 31. When the intensity of said electric field becomes of the order of $10^4$–$10^5$ v./cm. avalanche takes place and holes are injected into the i-region while electrons are injected from the n-region 33 into the i-region 31 to realize double injection. Thus a negative resistance is obtained. Even if the bias is reversed, a negative resistance is obtained because the structure of the apparatus is symmetrical.

Further, when pressure is applied to the junction between the regions 32 and 31 before avalanche breakdown occurs under the condition where a reverse bias is applied to said junction between the regions 32 and 31, generation-recombination centers are formed an avalanche breakdown takes place. Accordingly, a negative resistance characteristic appears at a lower turn-over voltage when pressure is applied than when pressure is not applied.

Figure 4:
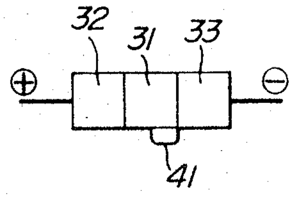

Also, if, as shown in FIG. 4, another n-type region 41 is formed on the i-region 31 in the same electric apparatus as shown in FIG. 3, the negative resistance of said apparatus becomes controllable. Namely, if electrons are injected from said other n-type region 41 into the i-region 31 before avalanche breakdown occurs under the condition that a reverse bias is applied to the junction between the regions 32 and 31, the thickness of the depletion layer around the junction decreases and the electric field becomes stronger. Accordingly, a negative resistance characteristic appears at a lower turn-over voltage compared with the case where no electrons are injected.

As has become apparent from the foregoing description, the electric apparatus according to the invention has a bilateral negative resistance characteristic and said negative resistance characteristic may be controlled with pressure or with a gate electrode.

Now, the embodiments of the invention will be described hereinbelow.

(1) The i-region is formed by doping a Si bulk with a deep-level impurity like Ni, Co, Au, Fe, Cu, Mn, Zn, etc. according to a known method. For example, a desired impurity is adhered to the surface of the Si bulk by vacuum evaporation or by plating and diffusing in an atmosphere of hydrogen gas at a high temperature, around 1000° C.

Figure 5:
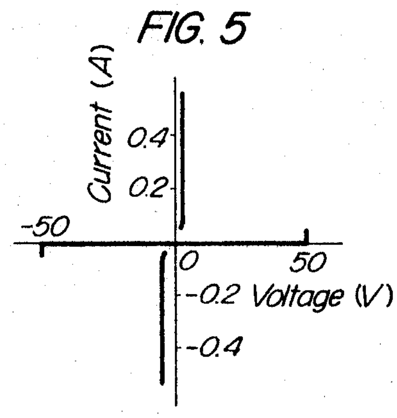
FIG. 5 is a diagram showing a voltage vs. current characteristic obtained with the apparatus shown in FIG. 3.

Then alloy junction is formed in this i-region by use of Au (0.8% Sb) to constitute n-i-n structure as shown in FIG. 3. The voltage-current characteristic of such an n-i-n device is a symmetrical, bilateral negative resistance characteristic as shown in FIG. 5.

If Al is used in said device instead of Au (0.8% Sb), the device becomes a p-i-p structure and a similar characteristic is obtained.

Figure 6:
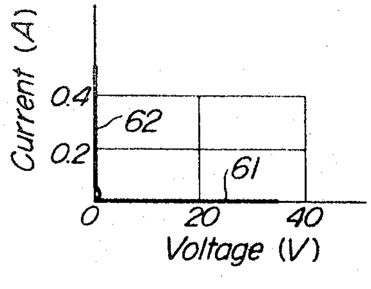
FIG. 6 shows a voltage vs. current characteristic obtained with a modified version of the apparatus shown in FIGS. 3.

FIG. 6, line 61 shows a current-voltage characteristic obtained with said device when no pressure is applied to the junction surface at which a reverse bias is present. When pressure is applied to this junction surface the device becomes "on" and a characteristic as shown by curve 62 is obtained.

(2) When the i-region of a semiconductor device having a bilateral negative resistance characteristic and having the structure of n-i-n or p-i-p, which is fabricated according to the method described in the embodiment (1), i.e. the region 31 in FIG. 4, is subjected to alloying with Au (0.8% Sb), the region 41 in FIG. 4 changes to an n-type region. When voltage is applied to this n-type gate control electrode, the turn-over voltage of the device changes. This is because electrons are injected through said gate electrode to reduce the thickness of the depletion layer around the junction, which is reversely junctioned, and because the turn-over voltage becomes lower compared to the case of no electron injection if the electric field becomes stronger.

Figure 7:
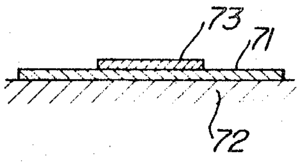
FIG. 7 is a sectional diagram of another electric apparatus embodying the present invention.

(3) Insulating $SiO_2$ film is formed on a metal substrate like a substrate of Ta etc. by vacuum evaporation. Then a deep-level impurity like Au, Co, Fe, Cu, Ni, etc. is vacuum evaporated over the $SiO_2$ film, heated and diffused in an atmosphere of oxygen. Further, Al is vacuum evaporated to form an electrode and thus the structure as shown in FIG. 7 is obtained. In the figure, 71 denotes the $SiO_2$ film doped with deep-level impurity, 72 is the metal substrate like that of Ta and 73 is the evaporated metal film like Al film. In this case, though Al and Ta are different in kind, they have the same type of conduction, i.e. the conduction as metal. In such an electric apparatus, a bilateral negative resistance characteristic as shown in FIG. 5 is obtained.

It is evident from the consideration on the principle of the invention that though Si is used as a semiconductor in the above description, Ge, GaAs, ZnS, CdS, InSb, CdTe, ZnO, PbO, etc. may also be used without changing the effect of the invention and that though $SiO_2$ is used as insulator, $BaTiO_3$, SiO or the like may be used without altering the effect of the invention.

As is fully explained above, the electric apparatus according to the invention may be applied to a switching element, a push-button switch, a mechanical-electrical transducer or the like and it enjoys a wide range of industrial application.

It is further to be noted that the negative resistance characteristic may be improved if rectifying junctions are used as electric connections.

What is claimed is:

1. A pressure sensitive bilateral negative resistance device comprising: a symmetrical semiconductor body comprising a first intrinsic layer with a deep-level impurity in the forbidden band, second and third layers each of the same extrinsic conductivity type forming junctions coextensive with said intrinsic layer on oppoiste sides thereof, means connected to said second and third layers for applying a voltage between said layers to cause avalanche breakdown in said body at a predetermined voltage value, and means for applying pressure to the reversed biased one of said junctions to lower the voltage value at which avalanche breakdown occurs.

2. A pressure sensitive bilateral negative resistance device according to claim 1, wherein said junctions are rectifying junctions and wherein the device has an n-i-n configuration.

3. A pressure sensitive bilateral negative resistance device according to claim 2, wherein a gate electrode is provided to the portion of said body doped with the deep-level impurity.

4. A pressure sensitive bilateral negative resistance device according to claim 1, wherein said junctions are rectifying junctions and wherein the device has a p-i-p configuration.

5. A pressure sensitive bilateral negative resistance device according to claim 4, wherein a gate electrode is provided to the portion of said body doped with the deep-level impurity.

References Cited

UNITED STATES PATENTS

| | | | |
|---|---|---|---|
| 3,132,408 | 5/1964 | Pell | 317—235 X |
| 3,249,764 | 5/1966 | Holonyak | 317—235 X |
| 3,284,750 | 11/1966 | Komatsubara | 307—306 X |
| 3,387,230 | 6/1968 | Marinace | 317—235 X |
| 3,246,172 | 4/1966 | Sanford | 307—88.5 |

JOHN W. HUCKERT, Primary Examiner

J. R. SHEWMAKER, Assistant Examiner

U.S. Cl. X.R.

307—302; 317—235; 338—13